(12) United States Patent
Popp et al.

(10) Patent No.: US 7,944,701 B2
(45) Date of Patent: May 17, 2011

(54) HOUSING FOR A POWER SEMICONDUCTOR MODULE

(75) Inventors: Rainer Popp, Petersaurach (DE); Marco Lederer, Nürnberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 390 days.

(21) Appl. No.: 12/069,777

(22) Filed: Feb. 13, 2008

(65) Prior Publication Data

US 2008/0212302 A1    Sep. 4, 2008

(30) Foreign Application Priority Data

Feb. 14, 2007 (DE) .......................... 10 2007 007 224

(51) Int. Cl.
*H05K 5/00* (2006.01)
(52) U.S. Cl. ........................................ 361/730; 361/807
(58) Field of Classification Search .................. 361/730, 361/749, 748, 807
See application file for complete search history.

(56) References Cited

U.S. PATENT DOCUMENTS

| | | | |
|---|---|---|---|
| 4,788,626 A | 11/1988 | Neidig et al. | |
| 5,438,479 A | 8/1995 | Heilbronner | |
| 5,761,046 A | * 6/1998 | Hein et al. | 361/752 |
| 6,185,100 B1 | * 2/2001 | Bentz et al. | 361/704 |
| 6,654,249 B2 | 11/2003 | Göbl et al. | |
| 6,924,985 B2 | 8/2005 | Kawakita et al. | |
| 7,667,971 B2 | * 2/2010 | Tominaga et al. | 361/706 |
| 7,697,300 B2 | * 4/2010 | Brandt et al. | 361/736 |

FOREIGN PATENT DOCUMENTS

| | | | |
|---|---|---|---|
| DE | 31 43 339 | | 5/1983 |
| DE | 3143339 | * | 5/1983 |
| DE | 36 04 882 | | 8/1987 |
| DE | 93 13 483 | | 2/1994 |
| DE | 101 27 947 | | 10/2002 |
| DE | 103 29 843 | | 1/2004 |
| EP | 0 717 588 | | 6/1996 |
| WO | WO03078211 | * | 9/2003 |

* cited by examiner

*Primary Examiner* — Yuriy Semenenko
(74) *Attorney, Agent, or Firm* — Cohen Pontani Lieberman & Pavane LLP

(57) ABSTRACT

A housing for a power semiconductor module in which load-connecting elements having contact devices are arranged. The contact devices are arranged in housing troughs on the exterior of the housing. The housing troughs are formed at an associated lateral wall of the housing. The housing is closed off by a cover. The housing is preferably formed as a unitary piece of material having a circumferential sealing frame and the cover includes an outer rim that extends over the circumferential sealing frame, to prevent the penetration of fluid or moisture into the power semiconductor module when the cover is closed. On its inner rim, each housing trough includes a sealing rib formed of a section of the sealing frame. The associated load-connecting element is crimped about the sealing rib, so that the contact device is disposed within the trough.

6 Claims, 4 Drawing Sheets

HOUSING FOR A POWER SEMICONDUCTOR MODULE

BACKGROUND OF THE INVENTION

1. Field of the Invention

The invention relates to a housing for a power semiconductor module, and, more particularly, to such a housing in which load-connecting elements with respective contact devices are arranged, the contact devices being located in troughs formed in an associated lateral wall of the housing, the housing also having a cover.

2. Description of the Related Art

Many types of power semiconductor modules are known, in some of which the housing is designed to receive at least one electrically insulating substrate, preferably intended for mounting on a cooling component. The substrate consists of a body made of an insulating material and has a number of metallic strip conductors located thereon. The strip conductors are electrically insulated from one other, and are connected to respective power semiconductor elements, in a correctly switched manner. In addition to the load-connecting elements, the power semiconductor modules have auxiliary connecting elements, which are in the form of control connectors for the power semiconductor components.

For example, U.S. Pat. No. 5,438,479 describes a power semiconductor module with a pressure device which has a rigid, preferably metallic, pressure element for building up pressure, an elastic cushion element for pressure storage, and a bridge element for introducing pressure to particular areas of the substrate surface. The bridge element is preferably designed as a molded plastic body having a face which points away from the cushion element and from which pressure fingers extend in the direction toward the substrate surface.

A further power semiconductor module is described in U.S. Pat. No. 6,654,249, in which the load-connecting elements are formed in such a way that they extend in sections closely adjoining each other perpendicularly with respect to the substrate surface and have contact bases, which provide the electrical contact with strip conductors provided on the substrate surface and simultaneously exert pressure on the substrate and in this way provide for thermal contact with a cooling component.

SUMMARY OF THE INVENTION

The object of the invention is to provide a housing for a power semiconductor module of the type described above, which is simply designed and is dependably protected against the penetration by fluids or moisture.

In accordance with the invention, there is provided a housing for use with a semiconductor module in which the housing is formed as a unitary piece of material with a circumferential sealing frame, and has a cover that includes an outer rim extending over the circumferential sealing frame.

The inventive housing for a power semiconductor module prevents the infiltration of fluids or moisture from dew or the like into the power semiconductor module, which could cause the failure of the power semiconductor module, in a relatively simple manner.

It is considered particularly advantageous if the housing trough has, on its inner rim, a sealing rib constituting a section of the sealing frame, and if the associated load-connecting element is formed with a section formed around the sealing rib, e.g., by crimping, which is followed by the contact device of the respective load-connecting element. In this way the crimped section of the respective load-connecting element offers mechanical stress relief, as well as an element for compensating temperature-related longitudinal changes.

It is also advantageous if the sealing rib has a height which is greater than the depth of the associated housing trough. It is also preferred that the sealing rib has a height which is greater than the wall thickness of the contact device of the respective load-connecting element. Such dimensioning prevents the infiltration of fluid, or condensation moisture into the interior of the housing, but instead causes any fluid to run off on the exterior.

In accordance with a preferred embodiment of the invention, the circumferential sealing frame may be formed integrally with the remainder of the housing, i.e. the frame can be simply produced of the same material as the housing, for example by injection molding. However, it can be preferred if the sealing frame, or at least the sealing ribs assigned to the load-connecting elements, have an elastic sealing element on their upper rim. This sealing element can be a sealing cord, or bead, which is placed, or affixed, e.g. by cementing, into a groove formed in the sealing frame, or in the respective sealing rib. It is also possible that the sealing element is produced directly and integrally with the housing during a two-component injection molding process.

If the cover includes a rim that extends over the crimped section of the load-connecting elements, it provides protection against the infiltration of moisture into the housing. This rim section preferably extends over the remaining sections of the circumferential sealing frame of the power semiconductor module in accordance with the invention.

In accordance with the invention, a housing can also be provided for a partial module. However, it is preferred if the housing is intended for a number of partial modules. If the partial modules are, for example, so-called partial bridges, it is possible in accordance with the invention to realize, for example, a three-phase full bridge with a common housing and a cover which closes it.

Further details, characteristics and advantages or essential details thereof, ensue from the following description of an exemplary embodiment of the power semiconductor module represented in the drawings.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is shown with reference to the accompanying drawings, in which like numerals refer to like elements.

DETAILED DESCRIPTION OF THE PRESENTLY PREFERRED EMBODIMENTS

Figure 1:
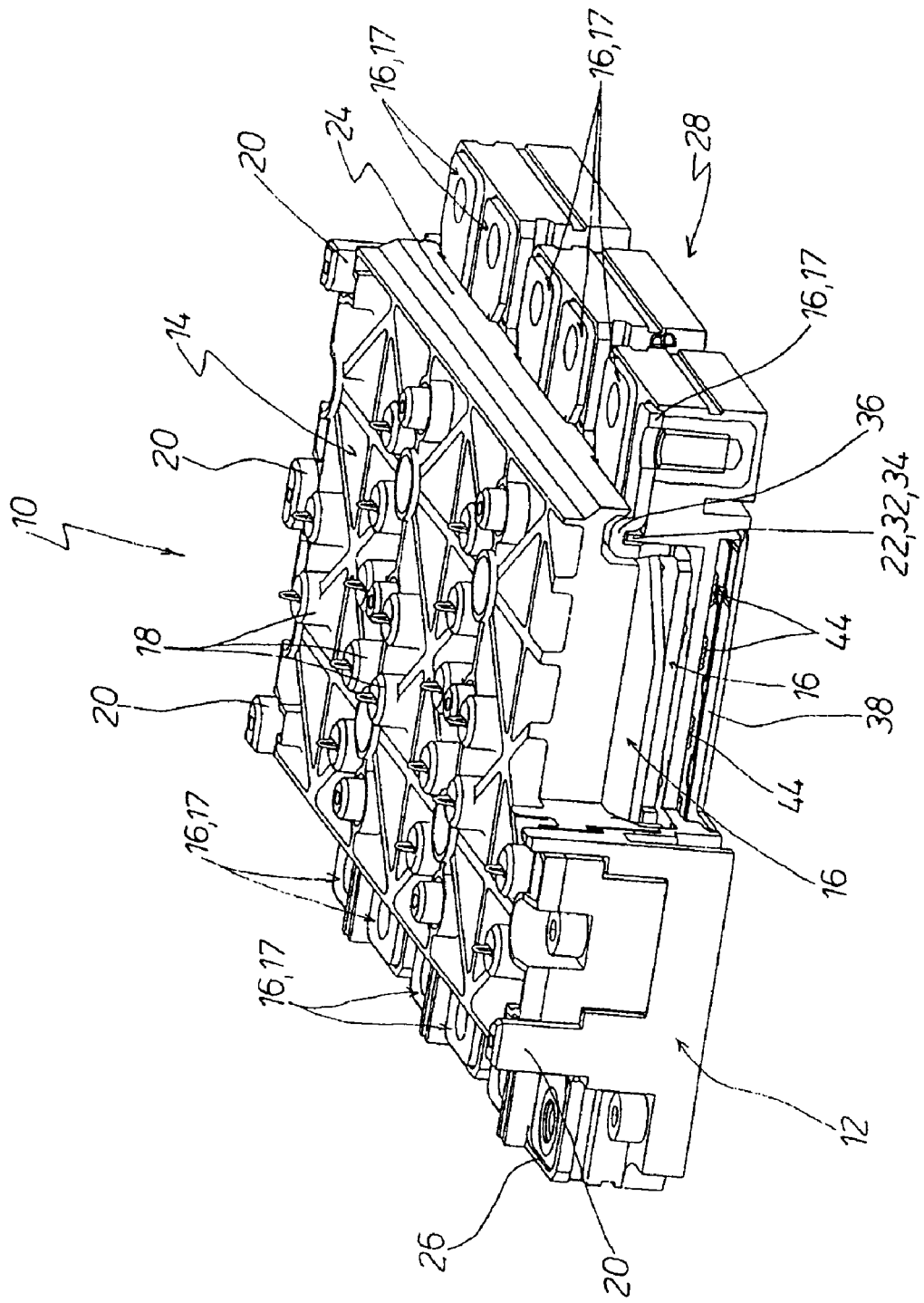
FIG. 1 is a perspective view of an embodiment of a power semiconductor module incorporating the inventive housing, shown partly in section.

FIG. 1 shows, generally at 10, an embodiment of a power semiconductor module 10 having a housing 12 in accordance with the invention. Housing 12 includes a cover 14 which closes off the top of housing 12. Load-connecting elements 16 protrude with their respective contact devices 17 out of the housing 12. Cover 14 includes raised portions 18 for allowing contact with auxiliary connecting elements (not shown). Bearing shoulders 20 project away from housing 12, on which a circuit board (not shown) can be fastened.

Figure 2:
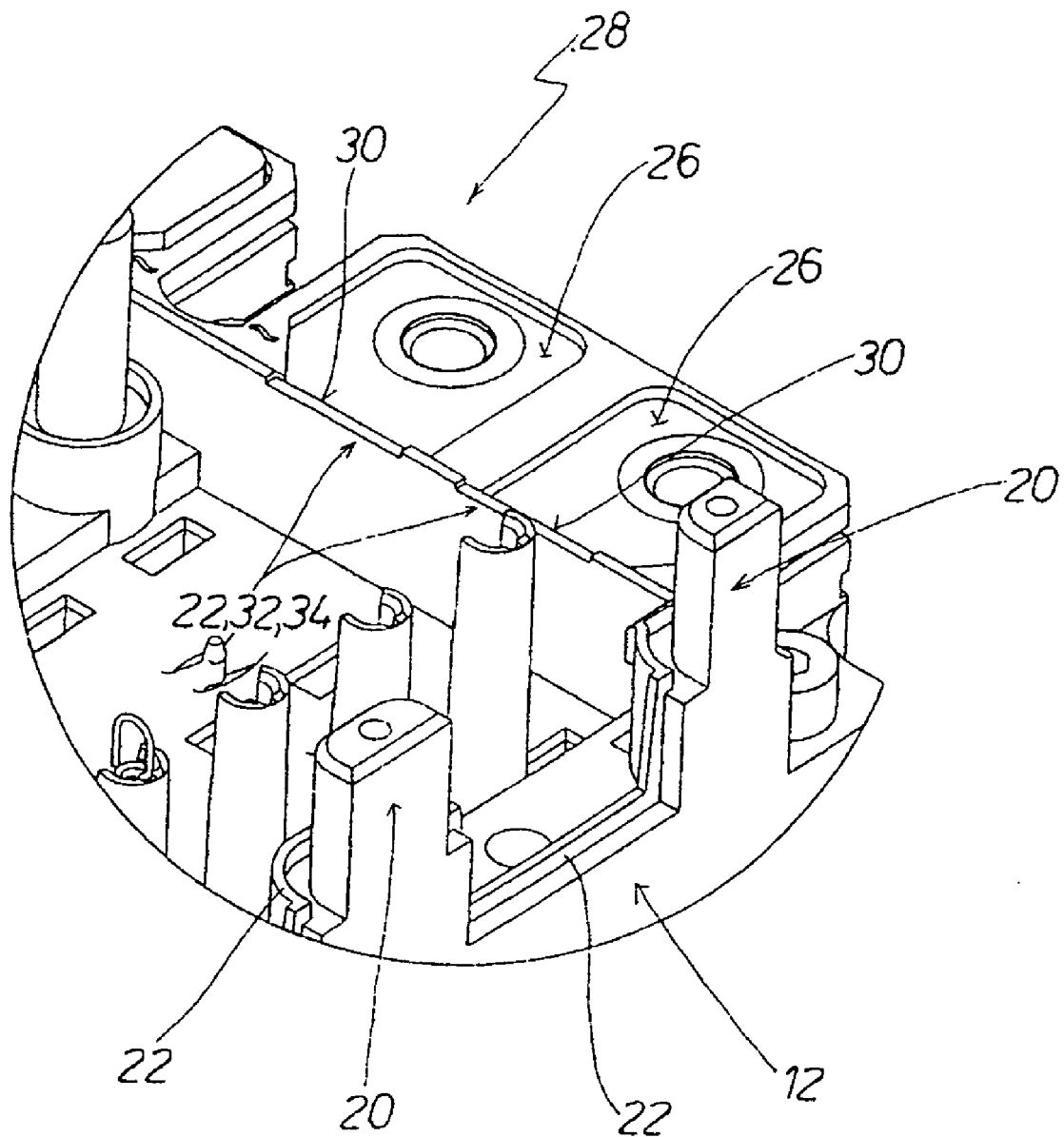
FIG. 2 is a perspective view of a detail of the inventive housing.
Figure 4:
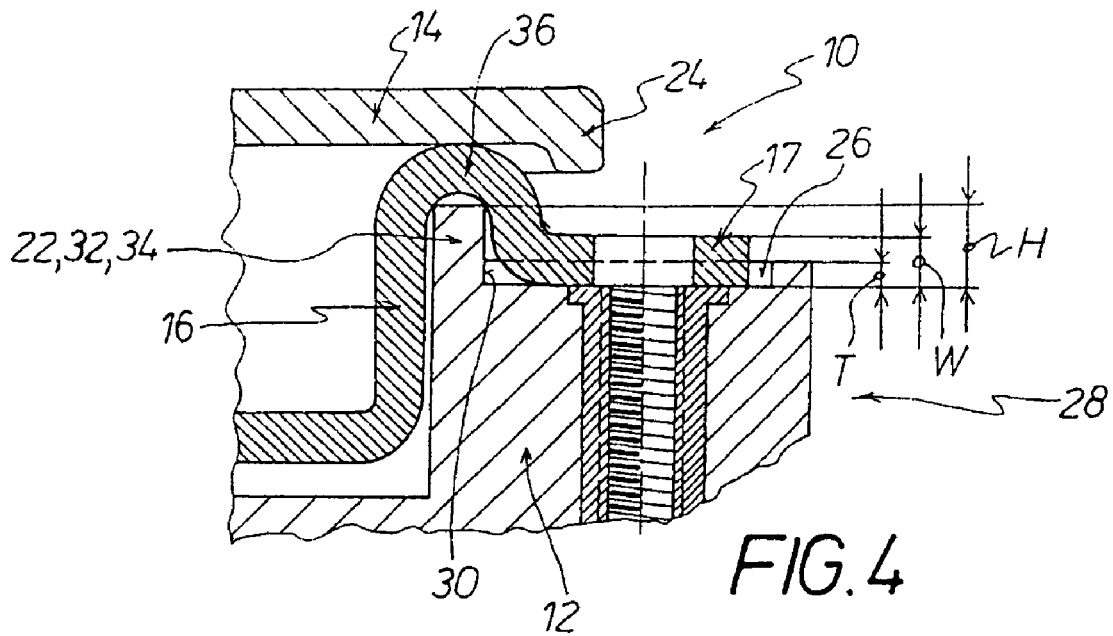
FIG. 4 is a sectional view of the housing, load-connecting element and cover of FIG. 1.

As can be seen in FIG. 2, on its top the housing 12 is preferably integrally formed with a circumferential sealing frame 22, over which an outer rim 24 of cover 14 projects (FIG. 4).

Housing 12 includes housing troughs 26 (see FIG. 2), which are provided to receive contact devices (see FIG. 1). Housing troughs 26 are formed on an associated lateral wall 28 of housing 12. On its inner rim 30, each housing trough 26 has a sealing rib 34, which constitutes a section 32 of sealing frame 22.

Figure 3:
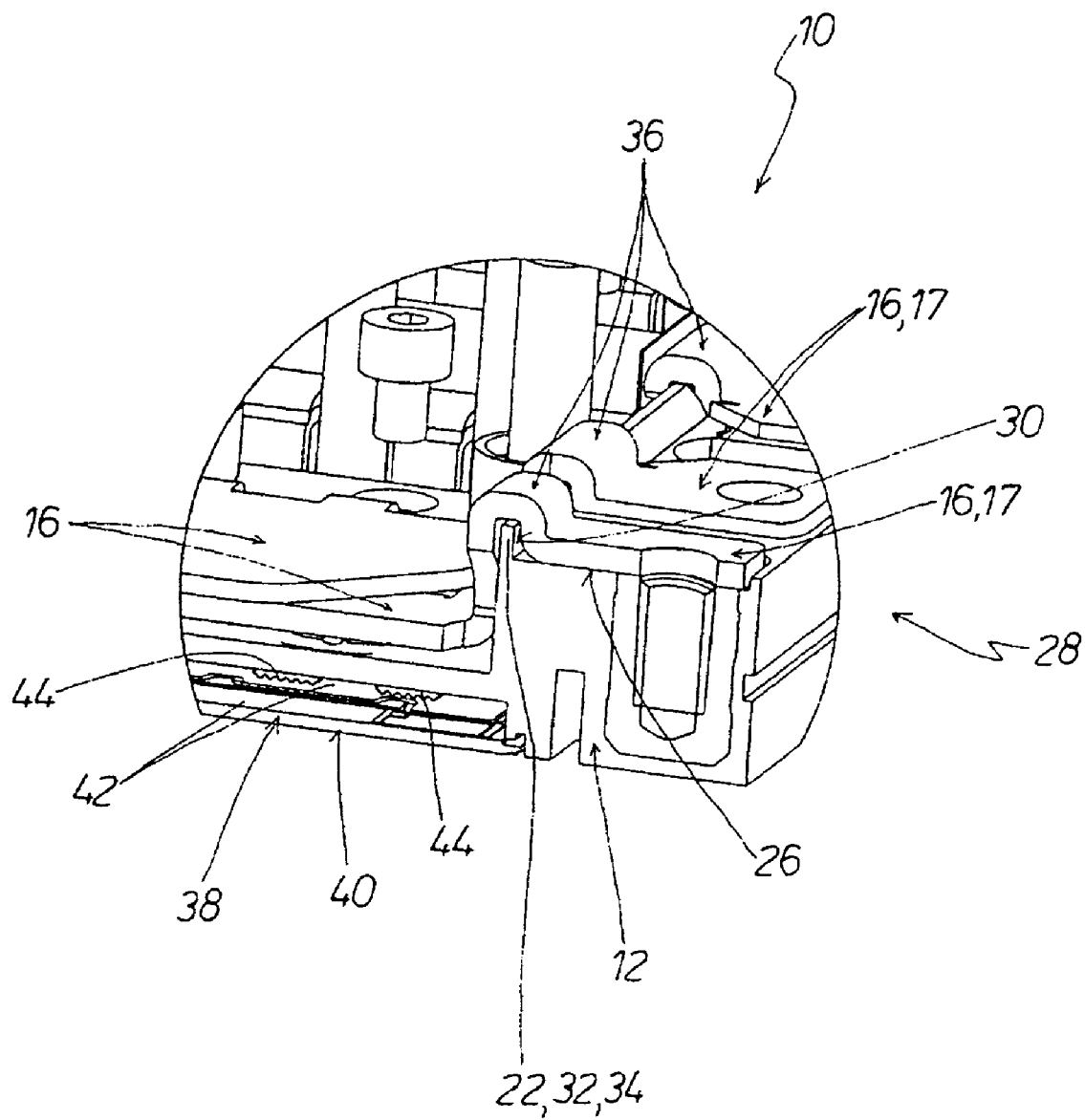
FIG. 3 is a perspective view of a section of the housing showing the load-connecting element, as well as of a substrate of the power semiconductor module, in section.

As can be seen in FIG. 3, the respective load-connecting element 16 includes a section 36, which is formed around an associated sealing rib 34, for example by crimping, and which is followed by an associated contact device 17.

In FIG. 3, a substrate 38 of the power semiconductor module 10 is fitted to the underside of housing 12. On its underside, substrate 38 is equipped with a flat metallic layer 40, and on its top, i.e. its interior, with a structured metallic layer 42, and is equipped with electronic power components (not separately shown).

In a manner known per se, load-connecting elements 16 are embodied with contact bases 44, which are brought into contact with structured metallic layer 42 of substrate 38.

As can be seen from FIG. 4, sealing rib 34 has a height (H), which is greater than the depth (T) of the associated housing trough 26. The height (H) of the respective sealing rib 34 is also greater than the wall thickness (W) of the associated contact device 17. FIG. 4 illustrates that cover 14 extends with its outer rim 24 over circumferential sealing frame 22 of housing 12, so that infiltration of fluid, or moisture, into the interior of the power semiconductor module 10 is prevented.

Figure 5:
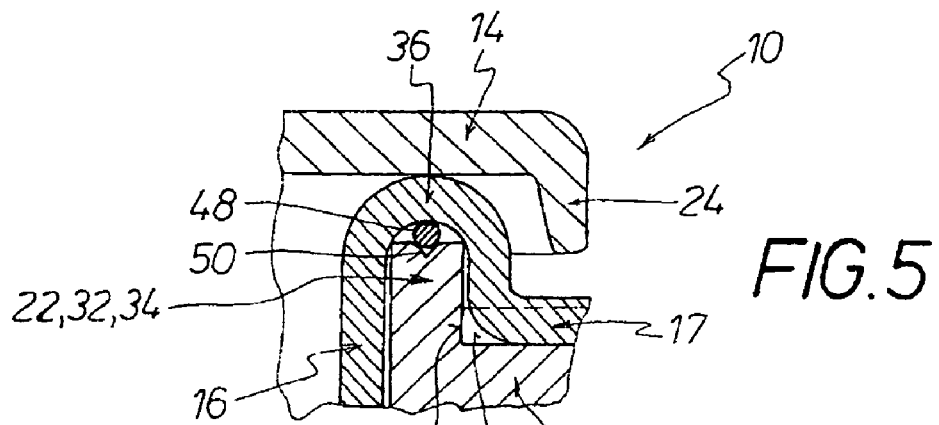
FIG. 5 is a sectional view, similar to a detail of FIG. 4, of another embodiment of the housing.
Figure 6:
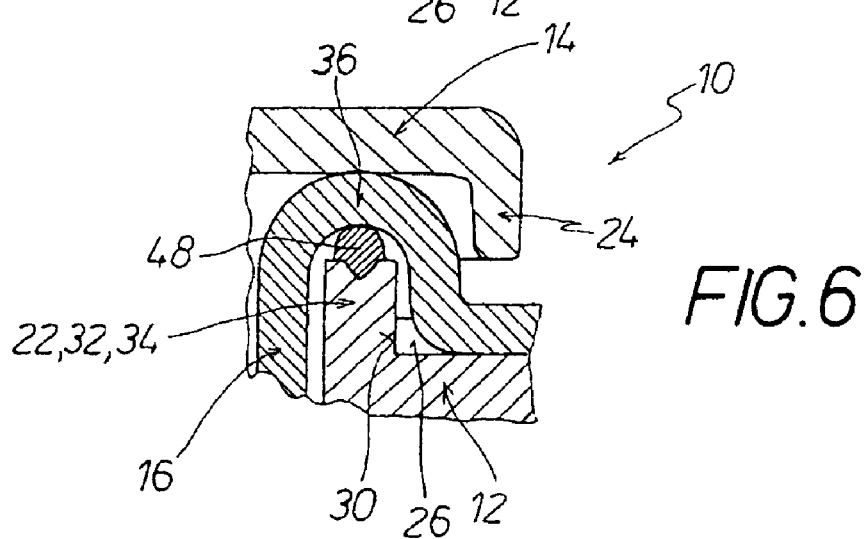
FIG. 6 is a sectional view, similar to FIG. 5, of still another embodiment of the inventive housing.

In a partial sectional view similar to FIG. 4, FIG. 5 shows an embodiment of the power semiconductor module 10, in which sealing frame 22 of housing 12, or at least the respective sealing rib 34, includes an elastic sealing element 48 on its upper rim 56. This elastic sealing element 48 can be, for example, a sealing cord, or bead, which is arranged, glued, or otherwise placed into a groove 50 formed in upper rim 46. In contrast to this, FIG. 6 shows in a partial sectional representation similar to FIG. 5 an embodiment of the power semiconductor module 10, in which elastic sealing frame 48 is realized directly and integrally together with the housing 12 by two-component injection molding.

Identical details are identified in the drawing figures by the same reference numerals, so that in connection with all drawing figures it is not necessary to describe all details individually.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A housing for a power semiconductor module, the housing retaining at least one load-connecting element having a contact device and a non-linear section, the housing comprising:
    a frame having
        at least one lateral wall;
        said lateral wall including at least one trough configured to receive the respective contact device therein, said trough including an inner rim, and a sealing rib disposed on said inner rim, said sealing rib being formed of a portion of said frame and being dimensioned to mate with the non-linear section of the contact device; and
        a unitary top wall disposed atop said lateral wall; and
    a cover for covering the housing, said cover having an outer rim that extends over and beyond said top wall;
        whereby the non-linear section may interact with said sealing rib to have the electrical contact and thereby secure the contact device within said trough.

2. The housing of claim 1, wherein said sealing rib has a height which is greater than the depth of the associated trough.

3. The housing of claim 1, wherein said sealing rib has a height which is greater than the thickness of the contact device.

4. The housing of claim 1, further comprising an elastic sealing element disposed on said outer rim for providing a seal between said frame and said cover when said cover is in place atop said frame.

5. The housing of claim 1, wherein said cover includes a rim section which extends beyond the portion of load-connecting element that is formed over said sealing rib.

6. The housing of claim 1, wherein the housing is adapted to receive at least one of a substrate and a partial module.

* * * * *